United States Patent [19]

Basten

[11] Patent Number: 5,012,129
[45] Date of Patent: Apr. 30, 1991

[54] LINE DRIVER

[75] Inventor: Mark J. Basten, Halesowen, United Kingdom

[73] Assignee: Lucas Industries Public Limited Company, Birmingham, England

[21] Appl. No.: 530,884

[22] Filed: May 30, 1990

[30] Foreign Application Priority Data

May 31, 1989 [GB] United Kingdom ............... 8912461

[51] Int. Cl.$^5$ .................................... H03K 1/00
[52] U.S. Cl. ....................... 307/270; 307/254; 307/255; 307/454; 307/455; 307/313; 375/36; 379/324; 379/413
[58] Field of Search ............. 307/270, 254, 255, 240, 307/454, 455, 451, 313; 375/36; 379/324, 413

[56] References Cited

U.S. PATENT DOCUMENTS

| | | | |
|---|---|---|---|
| 3,649,769 | 3/1972 | Pest | 307/255 |
| 3,866,063 | 2/1975 | Long | 307/313 |
| 3,914,628 | 10/1975 | Pao et al. | 307/270 |
| 4,024,501 | 5/1977 | Herring et al. | 375/36 |
| 4,429,384 | 1/1984 | Kaplinsky | 375/36 |
| 4,678,942 | 7/1987 | Kanai et al. | 307/455 |
| 4,748,346 | 5/1988 | Emori | 307/270 |
| 4,801,825 | 1/1989 | Stanley et al. | 307/270 |
| 4,856,023 | 8/1989 | Singh | 375/36 |

Primary Examiner—Stanley D. Miller
Assistant Examiner—Scott A. Ouellette
Attorney, Agent, or Firm—Abelan Frayne Rezac & Schwab

[57] ABSTRACT

A line driver is provided for driving a twisted pair of lines with complementary data signals. The driver comprises NPN and PNP transistors arranged as complementary emitter followers with their emitters connected to a biasing resistor network to provide an arrangement capable of being used as a "wired-or" output.

7 Claims, 3 Drawing Sheets

LINE DRIVER

SUMMARY OF THE INVENTION

The present invention relates to a line driver, for instance of the type used for driving a "twisted pair" data bus.

According to the present invention, there is provided a line driver comprising: a first emitter follower having an input for receiving a first input signal and an output for connection to a first line; a second emitter follower having an input for receiving a second input signal, which is the complement of the first input signal, and an output for connection to a second line, the second emitter follower being complementary to the first emitter follower; and a biasing resistor network connected to the outputs of the first and second emitter followers.

Preferably the biasing resistor network comprises a first resistor connected between the outputs of the first and second emitter followers, a second resistor connected between the output of the first emitter follower and a first voltage source, and a third resistor connected between the output of the second emitter follower and a second voltage source. Preferably the first and second voltage sources comprise first and second supply lines, respectively.

BRIEF DESCRIPTION OF THE DRAWINGS

The invention will be further described, by way of example, with reference to the accompanying drawings, in which.

BACKGROUND OF THE INVENTION

Line drivers, for instance required to drive "twisted pair" data buses, have to meet various criteria. The conductors of a twisted pair bus are driven in anti-phase and, provided the signals supplied to the conductors are perfectly complementary, the bus radiates very little radio frequency interference (RFI). In particular, the switching edges of the complementary signals should coincide as nearly as possible in time.

Another common requirement, depending on the protocol in use, is that the line drivers must be capable of functioning in the "wired or" configuration. In such arrangements, several stations are connected to the bus and must be capable of transmitting at the same time without upsetting each other.

Figure 1:
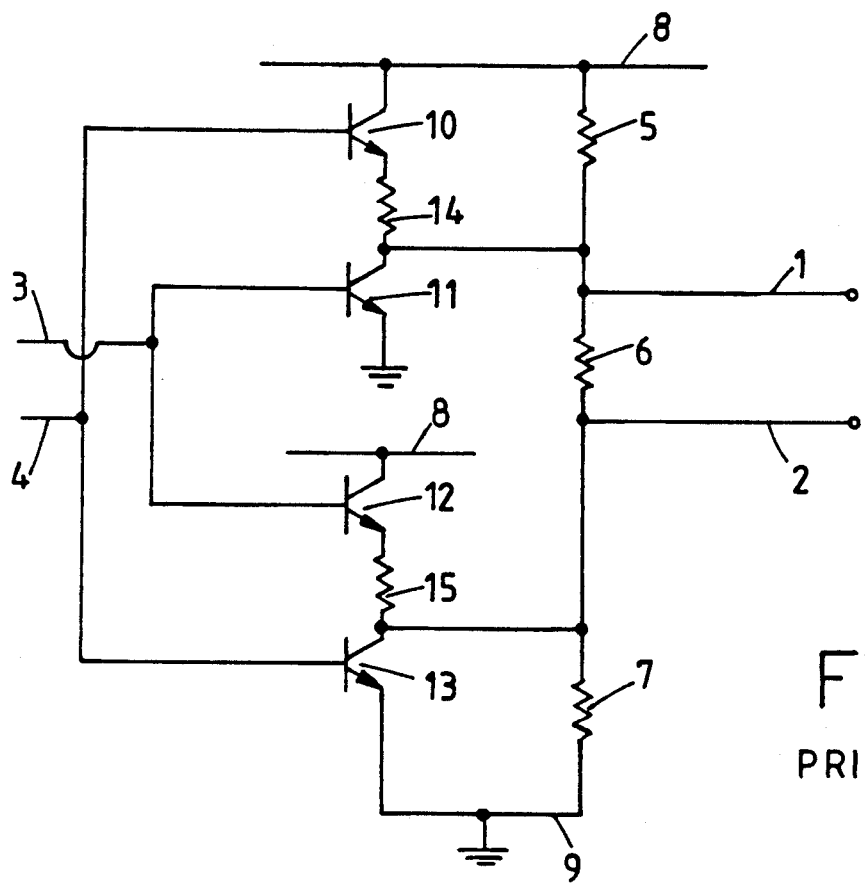
FIGS. 1 to 3 are circuit diagrams of known types of line drivers.

FIG. 1 shows a line driver of the "push-pull" type for driving the conductors 1 and 2 of a twisted pair data bus with data supplied to inputs 3 and 4. Three resistors 5, 6, and 7 are connected in series between a power supply line 8 and a ground line 9, and the conductors 1 and 2 are connected to the terminals of the resistor 6. The terminals of the resistor 6 are connected to the outputs of individual driver stages comprising transistors 10 to 13 and resistors 14 and 15. The bases of the transistors 10 and 13 are connected to the input 4 and the bases of the transistors 11 and 12 are connected to the input 3. Current limiting resistors in series with the bases of the transistors 11 and 13 are not shown. All of the transistors 10 to 13 are of the NPN type. However, the transistors 10 and 12 are connected as emitter followers whereas the transistors 11 and 13 are connected as common emitter switches. The transistors 11 and 13 are driven into saturation when they are turned on, whereas the transistors 10 and 12 are not saturated. As is well known, because of the base charge storage effect at saturation, the switching time of a transistor which operates in the saturated mode is longer than that of a transistor which does not become saturated during switching. This asymmetry in switching thus leads to relatively high levels of RFI caused by switching spikes on the line.

Other disadvantages of this circuit configuration are that it is not capable of operating in the "wired or" configuration and a relatively large number of components is required.

Figure 2:
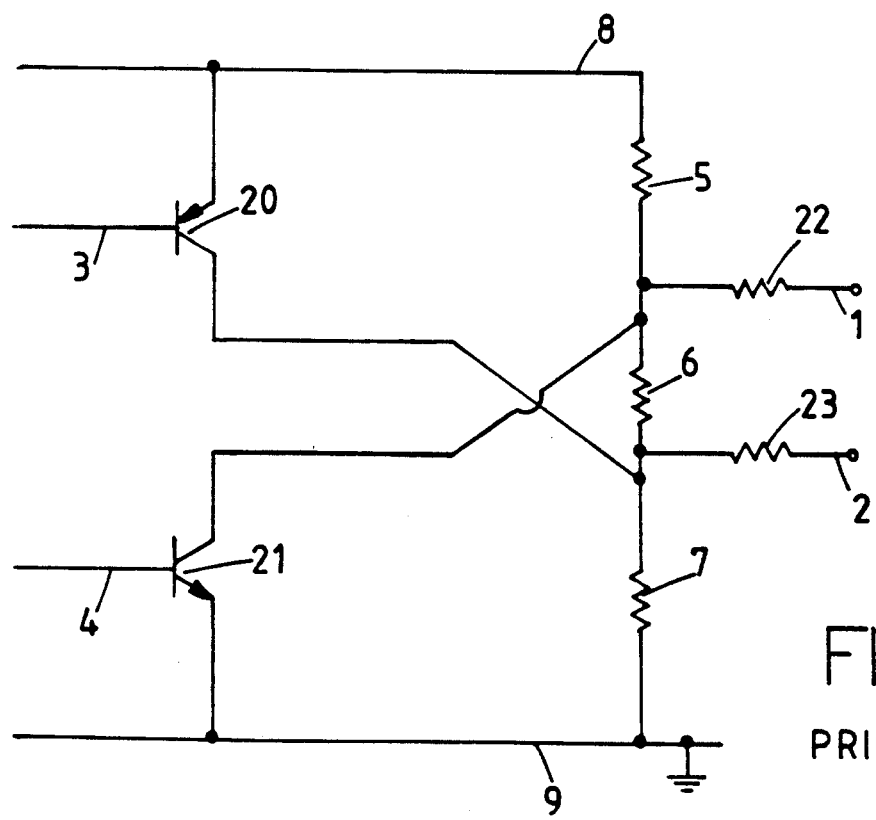

FIG. 2 shows another type of line driver having complementary data inputs 3 and 4 connected to the bases of PNP and NPN transistors 20 and 21, respectively, via current limiting resistors (not shown). The conductors 1 and 2 are connected via resistors 22 and 23, respectively, to a passive biasing arrangement comprising resistors 5, 6, and 7 connected similarly to those shown in FIG. 1 between a supply line 8 and a ground line 9. The transistors 20 and 21 are connected as common emitter switches and are therefore alternately driven into saturation. However, because of inherent differences in carrier mobility between NPN and PNP transistors, the switching characteristics of the transistors 20 and 21 are different so that this arrangement also produces large transient spikes on the twisted pair bus leading to high levels of RFI. However, this arrangement is capable of operating in the "wired or" configuration.

Figure 3:
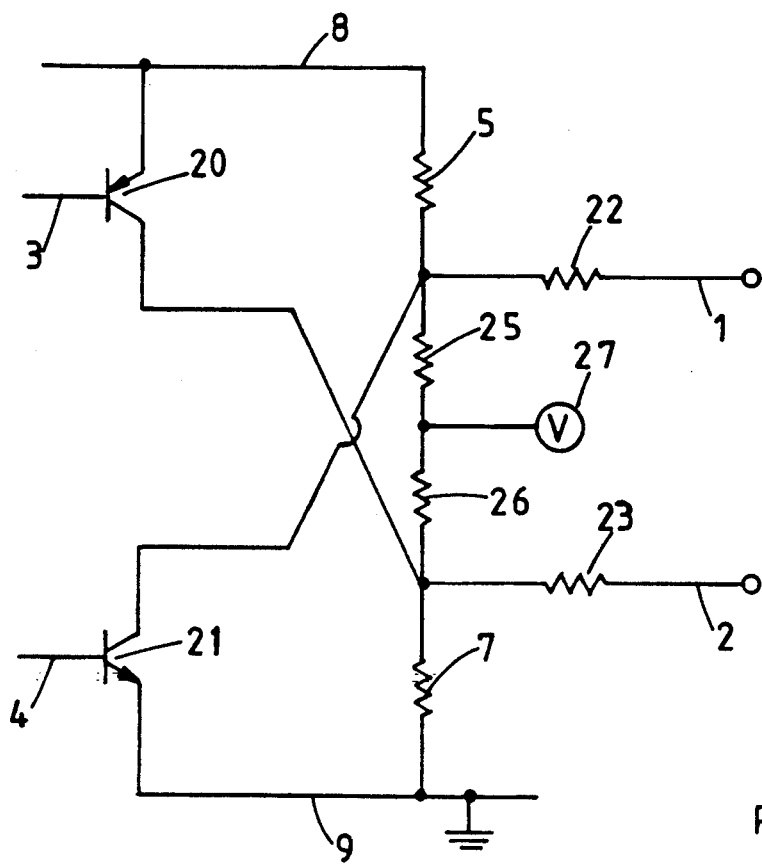

FIG. 3 shows a possible modification to the arrangement of FIG. 2, with like reference numerals referring to like parts. The difference between these arrangements is that the resistor 6 of FIG. 2 is replaced by two resistors 25 and 26 connected in series with their common terminals being connected to a voltage source 27 so as to provide active biasing. This modification also essentially solves the problems of unbalanced switching by removing the dependence of the voltage on one line to that on the other. However, this modified arrangement has the disadvantages of increased complexity and the requirement for a relatively large number of components, although it is capable of operating in the "wired or" configuration.

DESCRIPTION OF THE PREFERRED EMBODIMENTS

Figure 4:
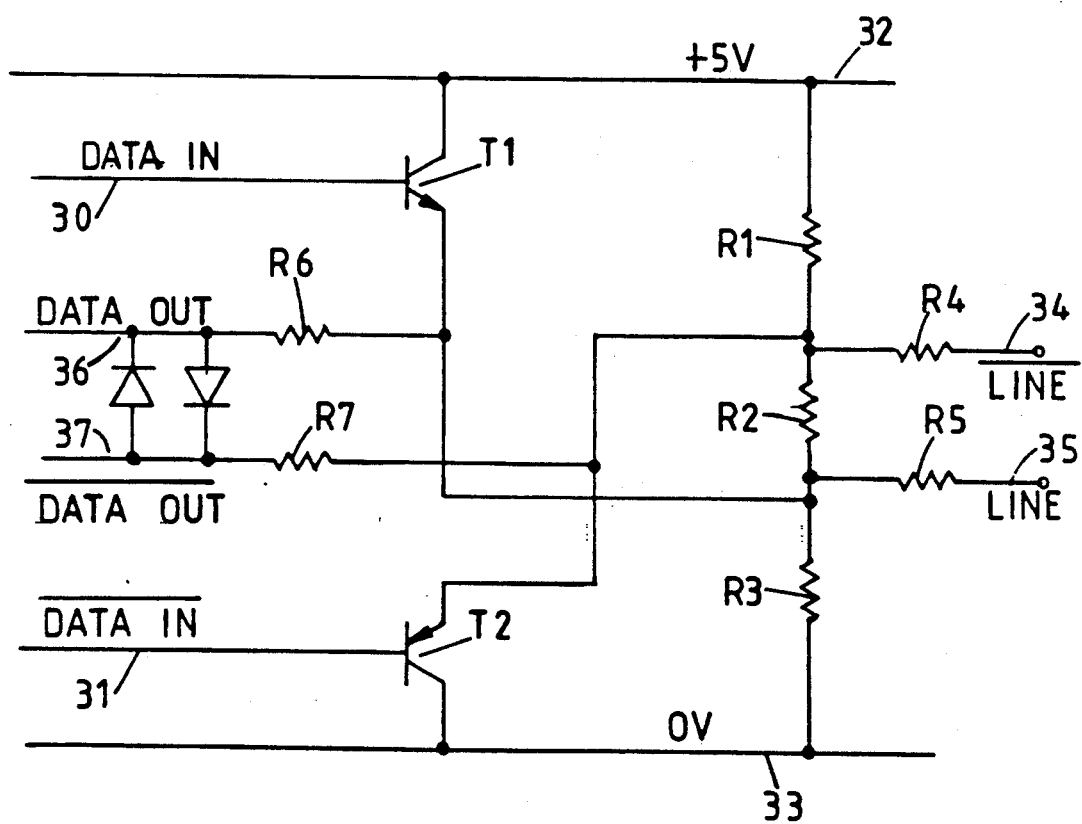
FIG. 4 is a circuit diagram of a line driver constituting a preferred embodiment of the invention.

FIG. 4 shows a line driver constituting a preferred embodiment of the invention. The line driver comprises NPN and PNP transistors T1 and T2, respectively, operating in the common collector or emitter follower mode. The bases of the transistors T1 and T2 are connected to inputs 30 and 31 which receive complementary data signals "DATA IN" and "$\overline{\text{DATA IN}}$", respectively. A passive biasing arrangement comprising resistors R1, R2, and R3 connected in series is provided between a +5 volt supply line 32 and a 0 volt or ground line 33. The conductors 34 and 35 are connected via resistors R4 and R5 to the junction of the resistors R1 and R2 and the emitter of the transistor T2 and the junction of the resistors R2 and R3 and the emitter of the transistor T1, respectively. The line conductors 34 and 35 carry complementary signals "$\overline{\text{LINE}}$" and "LINE", respectively. The emitters of the transistors T1 and T2 are also connected via resistors R6 and R7, respectively, to complementary outputs 36 and 37 which supply output signals DATA OUT and $\overline{\text{DATA OUT}}$, respectively, corresponding to signals received from the bus. This arrangement is capable of operating in the wired or configuration.

The line driver shown in FIG. 4 has two operating states. In a first state, the input 30 is at logic low level and the input 31 is at logic high level. The base/emitter junctions of the transistors T1 and T2 are thus reverse biased and the voltages supplied to the conductors 34 and 35 are determined by the resistors R1, R2, and R3 (assuming that no other line drivers are active).

In the other state, the input 30 is at logic high level and the input 31 is at logic low level. The base of the transistor T1 is therefore at +5 volts and the base of the transistor T2 is at 0 volts so that both the transistors T1 and T2 operate in their active region but are not saturated. The emitter of the transistor T1 is therefore at approximately +4.3 volts (+5 volts less the forward base/emitter voltage) and the emitter of the transistor T2 is at approximately 0.7 volts (the forward base/emitter voltage of the base/emitter junction). The voltages at the conductors 34 and 35 are determined by the emitter voltages of the transistors T1 and T2 and the resistors R4 and R5.

During transitions between the two states of the line driver, neither of the transistors T1 and T2 enters saturation. Switching by these transistors is therefore substantially symmetrical so that relatively low levels of RFI are produced.

The arrangement of FIG. 4 thus substantially overcomes the problems inherent in the arrangements shown in FIGS. 1 to 3. The arrangement of FIG. 4 uses passive line biasing and does not therefore require the additional components associated with active line biasing. Further, the arrangement of FIG. 4 permits the use of distributed line biasing which in turn provides greater reliability.

Figure 5:
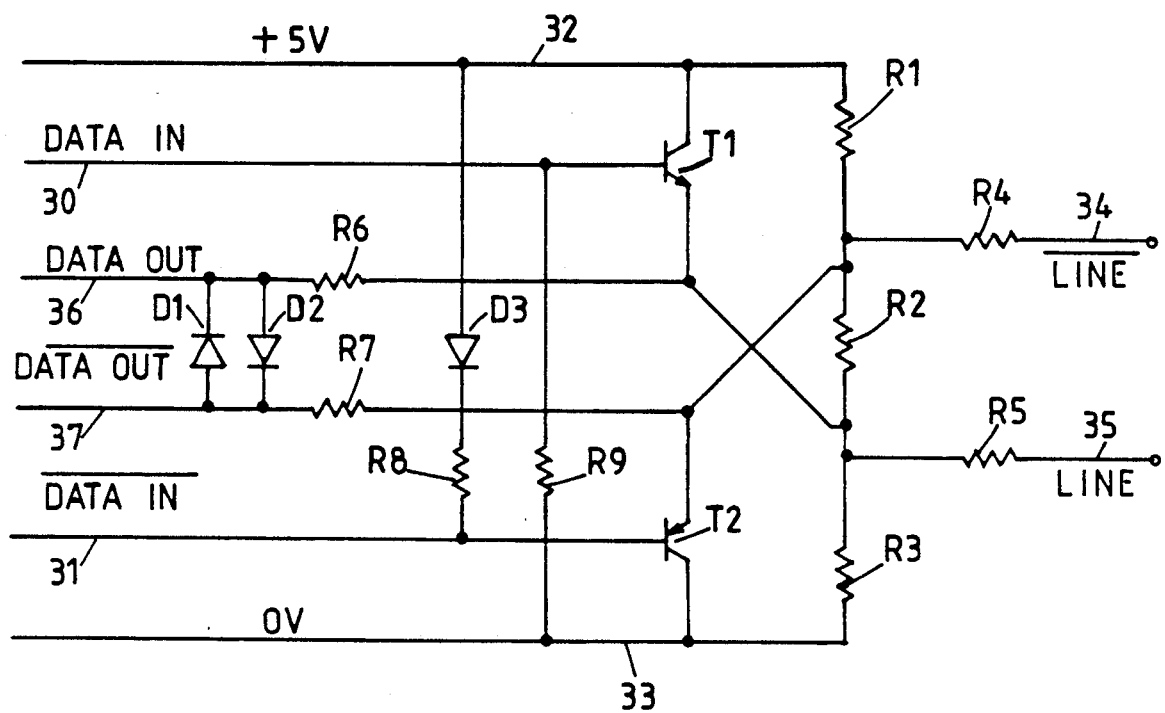
FIG. 5 is a circuit diagram of a line driver constituting a second embodiment of the invention.

FIG. 5 shows a modification of the line driver shown in FIG. 4. The same reference numbers refer to corresponding parts which will not be described again.

The line driver shown in FIG. 5 differs from that shown in FIG. 4 in that the base of the transistor T1 is connected via a resistor R9 to the common line and the base of the transistor T2 is connected to the positive supply line via a resistor R8 and a diode D3 in series. The anode of the diode D3 is connected to the positive supply line whereas its cathode is connected to the resistor R8 so that, in normal use, the diode D3 is forward-biased.

The presence of the resistors R8 and R9 and of the diode D3 prevents any malfunctions in a transmitting arrangement including the line driver from affecting normal operation of the bus. In particular, in the event that the input lines $\overline{\text{DATA IN}}$ and DATA IN become disconnected, the resistors R8 and R9 and the forward-biased diode D3 tie the bases of the transistors T1 and T2 to the respective power supply lines. Thus, the base-emitter junction of the transistor T1 is reverse-biased so that the transistor T1 has no effect on normal operation of the LINE. Similarly, the resistor R8 and the diode D3 remove the forward bias to the base-emitter junction of the transistor T2 so that the transistor T2 does not effect normal operation of the $\overline{\text{LINE}}$.

In the event that power supply to the line driver is interrupted such that the positive supply line is at a voltage near or equal to zero volts, then, in the absence of the diode D3, the bus could be forced into a state in which normal data transmission could not occur. In particular, the presence of the resistor R8 would cause the base of the transistor T2 to be held at or near zero volts so that the base-emitter junction of the transistor T2 would be conducting. This would result in the flow of current from the junction of the resistors R1, R2 and R4 into the emitter of the transistor T2 which would cause the voltage on the $\overline{\text{LINE}}$ to fall and prevent the transmission of data on this LINE.

Because of the presence of the diode D3, in the event that the positive supply line falls to or near to zero volts, the diode D3 is reverse-biased so that the base emitter junction of the transistor T2 cannot conduct. The bus can therefore operate normally for transmission of data, despite the loss of power from the line driver.

Thus, the presence of a fault in the line driver does not affect the flow of data between other line drivers which are using the bus.

I claim:

1. A line driver for driving first and second lines, said line driver comprising first and second emitter followers and a biasing resistor network, said first and second emitter followers having first and second inputs, respectively, for receiving complementary input signals and first and second outputs, respectively, for connection to the first and second lines, respectively, said second emitter follower being complementary to said first emitter follower, said biasing resistor network being connected to said first and second outputs.

2. A line driver as claimed in claim 1, in which said first emitter follower comprises a bipolar NPN transistor and said second emitter follower comprises a bipolar PNP transistor.

3. A line driver as claimed in claim 2, further comprising first and second voltage sources, said biasing resistor network comprising a first resistor connected between said first and second outputs, a second resistor connected between said first output and said first voltage source, and a third resistor connected between said second output and said second voltage source.

4. A line driver as claimed in claim 3, in which a voltage of said first voltage source is less than a voltage of said second voltage source.

5. A line driver as claimed in claim 4, in which said first and second voltage sources comprise first and second supply lines, respectively.

6. A line driver as claimed in claim 5, further comprising fourth and fifth resistors, said NPN transistor having a base connected via said fourth resistor to said first supply line and said PNP transistor having a base connected via said fifth resistor to said second supply line.

7. A line driver as claimed in claim 6, further comprising a diode connected in series with at least one of said fourth and fifth resistors.

* * * * *